United States Patent [19]
Klaasen et al.

[11] Patent Number: 5,338,963
[45] Date of Patent: Aug. 16, 1994

[54] SOFT ERROR IMMUNE CMOS STATIC RAM CELL

[75] Inventors: William A. Klaasen, Underhill, Vt.; Wen-Yuan Wang, Hopewell Junction, N.Y.

[73] Assignee: International Business Machines Corporation, Armonk, N.Y.

[21] Appl. No.: 43,090

[22] Filed: Apr. 5, 1993

[51] Int. Cl.[5] .............................................. H01L 27/02
[52] U.S. Cl. .................................. 257/376; 257/429; 257/544; 257/903
[58] Field of Search ............... 257/903, 906, 369, 372, 257/373, 376, 429, 544; 365/156, 181

[56] References Cited

U.S. PATENT DOCUMENTS

| | | | |
|---|---|---|---|
| 4,287,574 | 9/1981 | Uchida | 365/156 |
| 4,524,377 | 6/1985 | Eguchi | 257/903 |
| 5,189,640 | 2/1993 | Huard | 365/156 |

Primary Examiner—Sara W. Crane
Attorney, Agent, or Firm—Whitham, Curtis & Whitham

[57] ABSTRACT

Soft error immunity of a storage cell is greatly increased by division of a storage node into at least two portions and location of those portions on opposite sides of an isolation structure, such as a well of a conductivity type opposite to that of the substrate in which transistors of the memory cell may also be formed. The isolation structure thus limits collection of charge to only one of the portions of the storage node and reduces charge collection efficiency to a level where a critical amount of charge cannot be collected in all but a statistically negligible number of cases when such charge is engendered by impingement by ionizing radiation, such as energetic alpha particles. The layout of the memory cell having this feature also advantageously provides a simplified topology for the formation of additional ports comprising word line access transistors and bit lines.

10 Claims, 3 Drawing Sheets

SOFT ERROR IMMUNE CMOS STATIC RAM CELL

BACKGROUND OF THE INVENTION

1. Field of the Invention

The present invention generally relates to the structure of cells of static memory devices and, more particularly, to a structure for cells of static memory devices which is substantially immune to so-called soft errors, generally caused by discharging of stored charge due to impact of energetic particles present in the environment.

2. Description of the Prior Art

Storage of data and instructions in a memory structure is necessary to virtually any data processor application. For this reason, among others, the development of high-performance memory structures has accompanied the development of data processing circuits and integrated microprocessors in particular. Thus, as integration density and processing power of microprocessors has increased, the same attributes have been sought in memory structures to obtain greater numbers of bits of storage per chip as well as to increase speed of the memory structure.

Memory structures are often considered to fall into one of two groups: dynamic memories and static memories. Dynamic memories offer the greatest potential for reduction of cell size and hence the potential for the greatest amount of storage per chip. Power consumption is also relatively low. On the other hand, the storage mechanism is almost entirely capacitive and, since some degree of leakage is unavoidable in any storage structure, the stored charge representing the stored data must be refreshed periodically. This requirement for periodic refreshing of stored data causes some periods during which the dynamic memory is not available to be read and thus increases the average cycle time and effectively reduces the speed of the response of the memory. Further, the mechanism for reading a dynamic memory essentially requires the use of the stored charge to cause a charge imbalance in a sense amplifier which establishes an appropriate logic voltage output for the memory. However, this operation also requires that the stored charge be rewritten to the cell, further increasing minimum read access time.

Highest memory read access speed is achieved by static random access memories (SRAMs). In such static memories, the data is stored in a bistable latch comprised of active circuits. Therefore no time is required for either refresh or other operations to restore charge after reading.

While SRAMs are not generally regarded as relying on stored charge (since, in normal operation, any charge lost through reading or leakage is continually replaced by operation of the active bistable circuit therein), when implemented with field effect transistors, voltages present on various nodes may cause storage of charge in a depletion region within or around a portion of the field effect transistors.

If an energetic particle from the environment, such as an alpha-particle, strikes an electrode surrounded by such a depletion region, electrons and holes will be generated within the underlying body of semiconductor material and will collect along the boundary of the depletion region. If the energetic particle strikes an electrode (e.g. an N-type transistor holding charge in a depletion region, the size of the depletion region and the voltage on the electrode will be reduced by the charge perturbation. Similarly, if an energetic particle strikes an electrode of a P-type transistor at low voltage, the charge perturbation will cause the voltage to be increased. Thus, if the charge perturbation is sufficiently large, the stored logic state may be reversed. This is commonly referred to as a "soft error" since the error is not due to a hardware defect and the cell will operate normally thereafter (although it may contain erroneous data until rewritten). Soft errors are increased by standby operation at reduced voltage.

Accordingly, a performance parameter of an SRAM storage cell is the critical charge, Qc, which is the amount of charge which will cause logic state reversal of the latch by causing a sufficiently large voltage disturbance. Unfortunately, both miniaturization and lowered operating voltages (migration to 3.3 V parts) of SRAM cells with higher integration densities and/or lowered operating voltages also reduce the value of Qc for stable operation of the cell. Accordingly, SRAMs have become increasingly vulnerable to soft errors. Accordingly, many attempts have been made to reduce this vulnerability to soft errors in recent years.

However, many of these efforts to reduce the incidence of soft errors often require additional electronic elements (such as additional transistors or even some refresh arrangement or redundant storage) which occupy additional space on the chip and reduce the potential degree of integration which is practical. Further, such additional elements often require further process steps or even additional layers to be formed in the semiconductor device, increasing cost and complexity and commonly reducing manufacturing yield. Accordingly, no particularly satisfactory solution to the problem of soft error reduction has heretofore been found.

Another feature of SRAMS which has recently become of interest is the provision of multiple ports for each cell. That is, the association of each cell with two or more independently operated bit lines. Such a feature allows effectively increased speed of access since a corresponding number of cells on an accessed word line could be read simultaneously or at least within the same memory cycle (since accessed addresses are a combination of the word line and bit line addresses). However, in known memory cell structures, the topology of the bit line access transistor in combination with the conductors forming the bit line and the connection to the bistable circuit are complicated since they have required additional insulator, semiconductor and conductor layers to be provided in the devices. Therefore, memories with more than two ports per cell are largely impractical and even the provision of a second port for each cell disproportionately increases cost and reduces manufacturing yield.

SUMMARY OF THE INVENTION

It is therefore an object of the present invention to provide a structure for a memory cell with markedly improved immunity to soft errors and which will exhibit extremely low soft error rates.

It is another object of the present invention to provide a two port memory cell structure with simplified topology which can be fabricated with little or no increase in manufacturing steps and at high yield.

It is a further object of the invention to provide a high performance SRAM cell which is highly immune to soft errors and can readily be formed with at least two ports while not requiring significantly greater chip space than conventional SRAM cells which do not exhibit these properties.

To achieve the above and other objects of the invention, a memory cell is provided including a semiconductor substrate of a first conductivity type, a well of a second conductivity type formed in the substrate, and two cross-coupled inverters, each including a storage node, the storage node comprising respective portions of each of at least two transistors of each of the cross-coupled inverters, a portion of the well of the second conductivity type being located between the respective portions of each of the at least two transistors.

In accordance with another aspect of the invention, a memory cell is provided including a storage node formed by at least two spatially separated depletion regions, and an isolation structure located between at least two of the spatially separated depletion regions for reducing collection of charge engendered by ionizing radiation in the vicinity of a first of the at least two spatially separated depletion regions and a second of the at least two spatially separated depletion regions.

In accordance with a further aspect of the invention, a memory cell is provided including a pair of cross-coupled transistor inverters formed at a surface of a substrate of a first conductivity type, at least two transistors of at least one of said cross-coupled inverters being formed at a surface of said substrate and connected to a storage node of said memory cell, and an isolation structure located in a portion of the surface of the substrate and extending between the at least two transistors.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
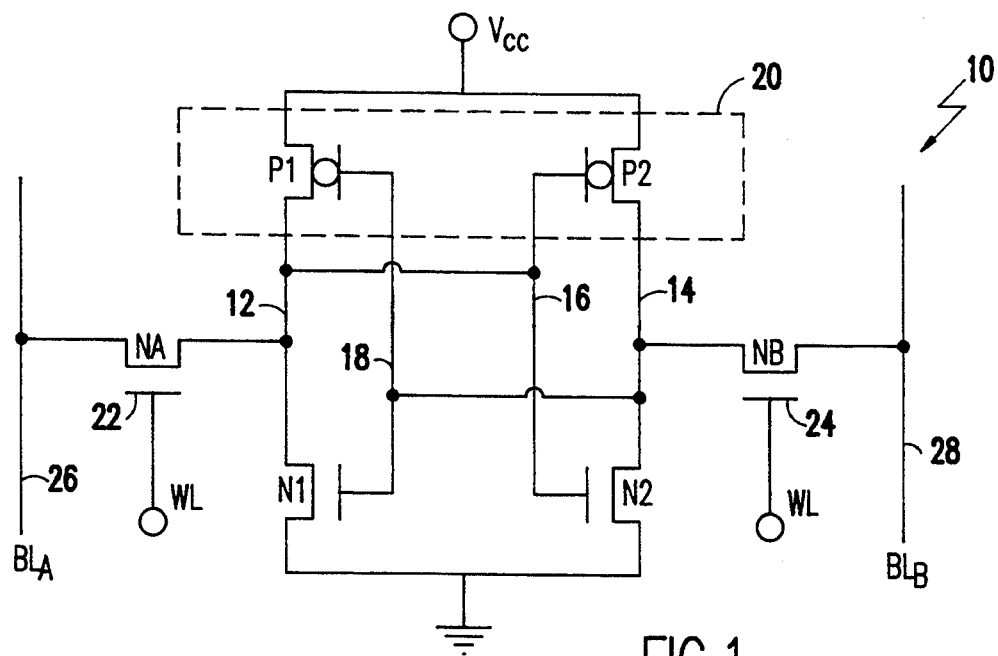
FIG. 1 is an schematic diagram of a memory cell over which the present invention represents an improvement.

Referring now to the drawings, and more particularly to FIG. 1, there is shown a memory cell 10 implemented in CMOS technology. While this memory cell configuration represents an exemplary cell of a type over which the present invention provides an improvement, it is to be understood that FIGS. 1, 2 and 6, captioned "RELATED ART", are specifically not admitted to be prior art as to the present invention.

In accordance with CMOS technology, to minimize the number of elements in the cell 10, both P-type and N-type transistors are provided in each of a pair of cross-coupled amplifiers or inverters. The P-type MOS transistors are located in a so-called N-well 20 since the formation of different types (N and P) of MOS transistors on a single chip requires different conductivity types of substrate. Accordingly, different conductivity types of substrate are effectively provided by forming a well within a substrate having an impurity type opposite to that of the substrate. While the invention will be described in terms of an N-well in a P-type substrate, as is most common, the conductivity types could be reversed without change in the principles underlying the present invention.

As is well-understood in the art, a logic level voltage applied in common to the gate electrodes of P-type and N-type transistors which tends to turn one transistor on will tend to turn the other transistor off. Therefore, the memory cell operates as cross coupled push-pull amplifiers; cross-coupling being provided between output nodes 12, 14 and input nodes 16, 18, respectively. Additionally to the bistable latch comprising the memory cell, word line access transistors and bit lines over which the cells are selectively addressed. The memory circuitry and the cell within it may also include further peripheral structure to provide a stand-by mode of operation at reduced voltage and power consumption at times other than when a read or write operation is being carried out. Such peripheral structure, not shown in the interest of clarity, is well-understood in the art and not important to an understanding of the principles of the invention or to facilitate the practice of the invention. However, it should be recalled that the reduced voltage operation also reduces the amount of charge on the critical node of the memory cell and increases susceptibility of the memory cell to soft errors.

In operation, only one of nodes 12 and 14 will be a so-called critical node at any given time. The critical node is the node with the high logic level voltage which includes the source and drain regions of transistors N1 and N2 forming the N-type transistor portion of the latch and the word line access transistors NA and NB. Free electrons and holes generated by ionizing radiation (such as an energetic alpha particle) which pass across the diffusion/substrate boundary are collected at the node. The charge collection reduces node voltage and will cause a soft error if the critical charge, Qc, is exceeded.

Figure 2:
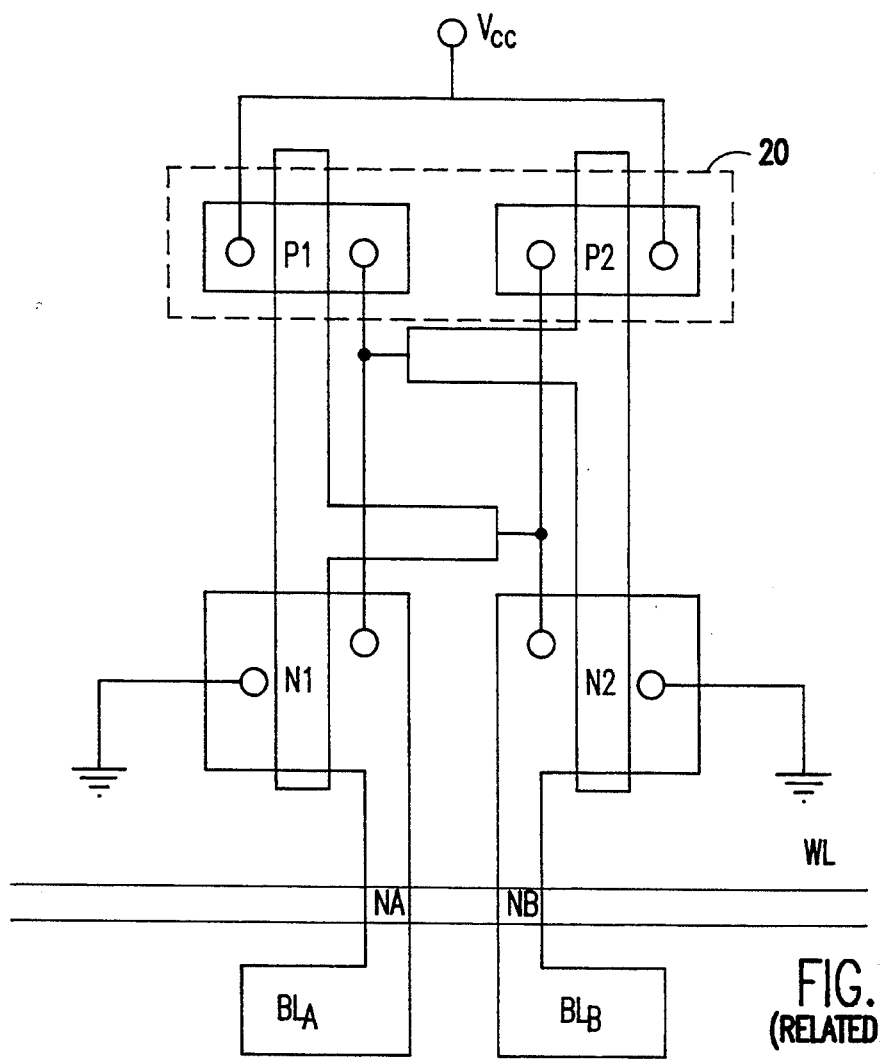
FIG. 2 is an diagram of an exemplary layout of the memory cell of FIG. 1.
Figure 6:
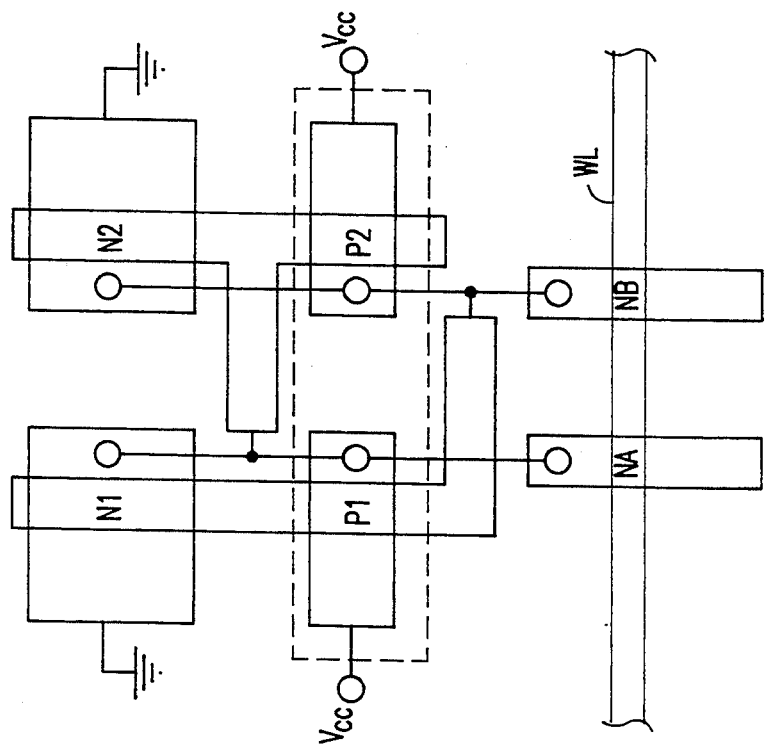
FIG. 6 is a variant form of the layout of the memory cell of FIG. 1 and particularly useful for comparison with the layout of the invention as shown in FIG. 5.

The vulnerability of memory cells such as that of FIG. 1 may be more readily appreciated from the exemplary and somewhat idealized layout of the memory cell shown in FIG. 2. A variant form reversing the locations of the N-type and P-type transistors is shown in FIG. 6 to facilitate comparison with the invention layout illustrated in FIG. 5. The same reference characters and numerals will be used in all of FIGS. 1, 2 and 6, insofar as possible. In FIGS. 2 and 6, the P-type latch transistors, P1 and P2, are, for example, formed in an N-well 20 which is, in turn formed in a P-type substrate. N-type latch transistors, N1 and N2, are formed adjacent thereto. N-type word line access transistors, NA and NB, are preferably formed adjacent to transistors N1 and N2 so that the gates thereof may be formed by word line WL having a relatively linear configuration. It will also be noted from FIGS. 2 and 6 that the area of the N-type latch transistors is approximately twice the area of the P-type latch transistors for reasons of performance and cell stability (e.g. to prevent change of cell state when the cell is read into the significant capacitance presented by the bit line). Therefore, the N-type latch transistors and the word line access transistors form a relatively large "target" for energetic particles.

Figure 3:
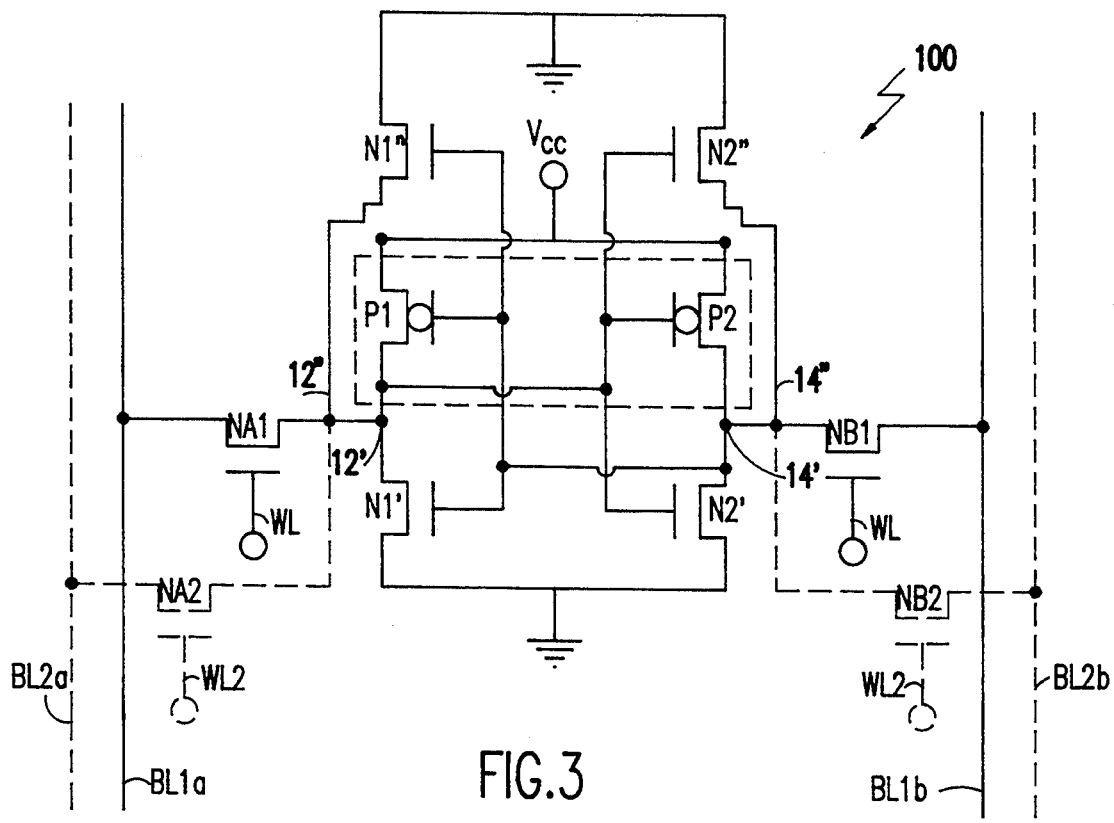
FIG. 3 is an schematic diagram of a memory cell in accordance with the present invention.
Figure 4:
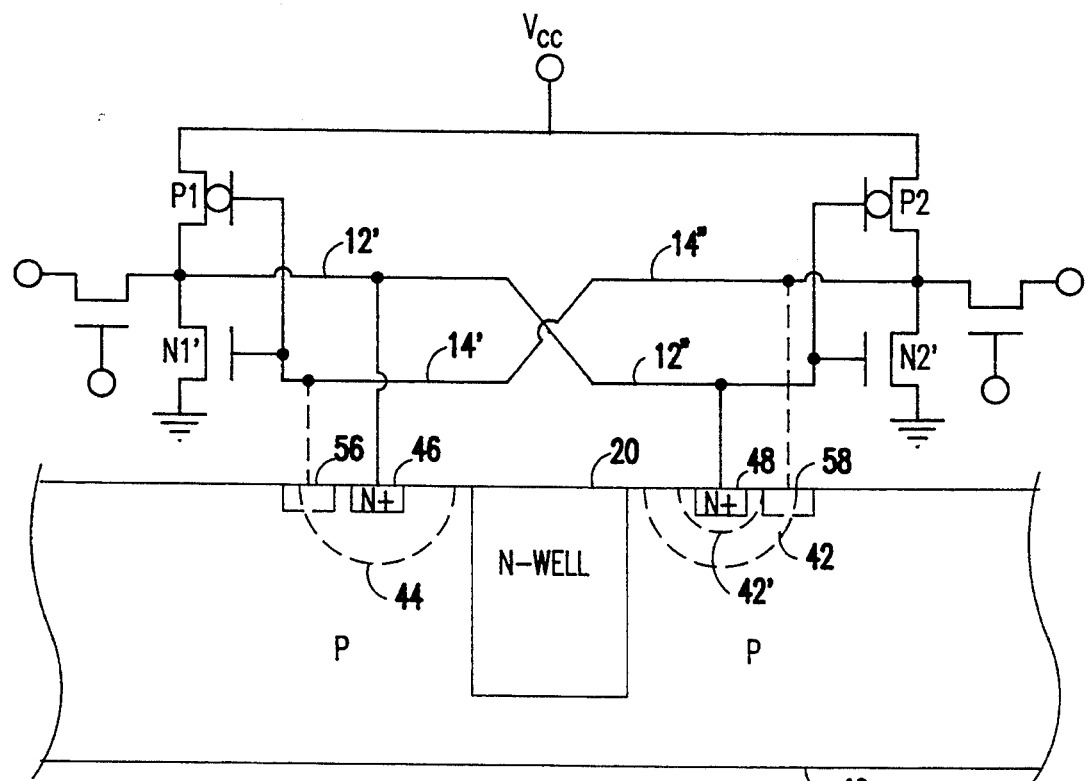
FIG. 4 is a hybrid schematic/structural diagram of a portion of a memory cell in accordance with the invention and useful in understanding soft errors and the immunity therefrom provided by the invention.

Referring now to FIGS. 3 and 4, the circuit and operation of the memory cell 100 in accordance with the invention will now be explained. In essence, the invention realizes immunity from soft errors by splitting the critical node (12 or 14 in FIG. 2) into two parts (12', 12" or 14', 14") and locating the two parts on opposite sides of the N-well in which the P-type latch transistors are formed. This is done by forming separate, parallel connected, N-type latch transistors, N1', N1" and N2', N2", (which can then be of reduced size in comparison with transistors N1 and N2 of the memory cell of FIG. 2) for each of the cross-coupled amplifiers in the latch. Since these transistors have been separated they can be located on opposite sides of the N-well which is preferably connected to Vcc to provide supply voltage to a conduction terminal of each of transistors P1 and P2. Thus, the N-well prevents electrons or holes generated by an energetic particle striking on one side of the N-well from affecting the depletion region on the other side of the N-well.

More specifically, as shown in FIG. 4, in which a portion of each of transistors N1" and N2" is depicted as formed in the substrate 40 while the remainder of the schematic diagram of FIG. 3 remains in schematic form. Assuming nodes 12', 12" to be the critical nodes, depletion regions 42 will exist in the substrate surrounding doped region 48 corresponding to node 12". A similar depletion region 44 will surround doped region 46 corresponding to node 12' (and transistor N1'). Depletion regions will also exist around doped regions 56 and 58 (shown in phantom) corresponding to nodes 14' and 14" (transistors N2' and N2", respectively). However, these are not critical nodes and any charge collected will reinforce the cell storage state.

Now, if it is assumed that an incident energetic particle causes generation of electrons and holes in the vicinity of depletion region 42 (which is, in essence, a parasitic capacitor), discharge of the stored charge and reduction of the size of the depletion region 42 to that depicted at 42' may result. The charge stored at depletion region 44 will not be affected by the electrons and holes so generated since N-well 20, held at Vcc, is interposed to prevent electrons from reaching the depletion region 44 although voltage will be reduced because the electrode 46 is tied to electrode 48 by a low resistance path connecting nodes 12' and 12". However, the amount of charge collected will be reduced due to the smaller size of the diffusion at each of nodes 12' and 12". Because the depletion region 42 has approximately one-half the area of the single depletion region associated with a cell design such as that of FIGS. 2 and 6, the charge collection is significantly reduced. The soft error rate is proportional to the probability the quantity of charge collected exceeds the critical charge required to reverse the cell state. Thus, even a small reduction in charge collection efficiency can result in a significant reduction in soft error rate as the level of charge collection is reduced below the critical charge. In the case of the present invention, the charge collection efficiency is substantially reduced for all conditions except where the energetic particle is so aligned as to strike both depletion regions 42 and 44, which has a statistically negligible probability of occurrence.

Figure 5:
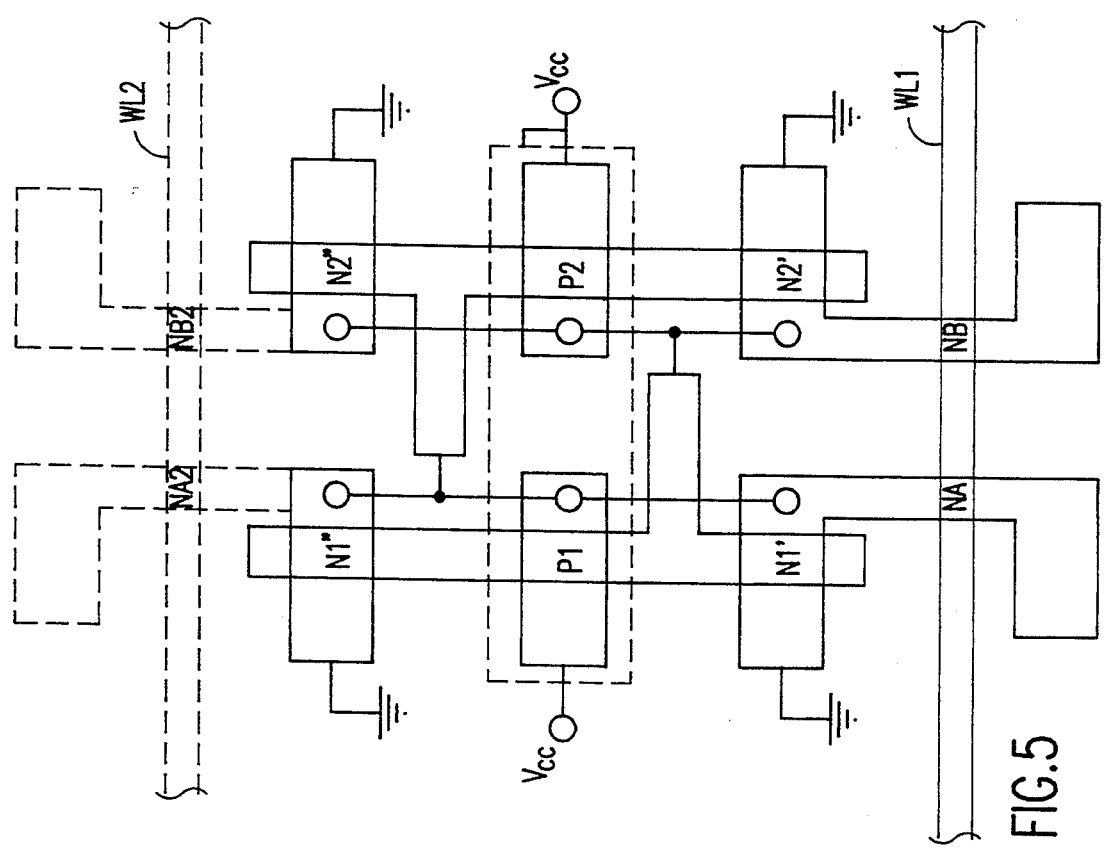
FIG. 5 is an diagram of an exemplary layout of the memory cell of the invention as shown in FIG. 3.

Several other advantages of the invention will be readily understood from FIG. 5, which shows a somewhat idealized, exemplary layout of the memory cell in accordance with the invention. First, the areas of transistors N1', N1", N2', and N2" are each reduced by half in comparison with transistors N1 and N2 of FIG. 2. Therefore, each of the transistors has only half the likelihood of being affected by an energetic particle as in the memory cell of FIG. 2. Additionally, no additional space is occupied by the transistors, as compared with FIGS. 2 or 6 and the only required increase in size of the memory cell is the space occupied by the required separation between structures on the substrate.

Returning briefly to FIG. 3, a second pair of word line access transistors NA2 and NB2 are provided in addition to word line access transistors NA1 and NB1 and selectively connect the output nodes of each of the cross-coupled amplifiers to bit lines BL2a and BL2b in the same manner as selective connection is made to bit lines BL1a and BL1b. This selectively parallel connection provides a second port for the memory cell 100. As shown in Phantom in FIG. 5, the layout of the memory cell in accordance with the present invention, by splitting of the critical node, provides a convenient location for the addition of a second port, including transistors NA2 and NB2, controlled by word line WL2. This second port is symmetrically located (adjacent one of the transistors of the cross-coupled amplifiers at a position generally opposite the well, across the transistor) and can be formed in the same layers and simultaneously with the first port, thus requiring very little, if any, additional increase in array cell area and limiting the number of process steps required. In practice, only the size (but not the number of processing steps) of the memory cell is increased and then only by about 25% (e.g. 28 square microns to 35.3 square microns) compared with the memory cells of FIGS. 2 and 6. Even this size penalty can be reduced by formation of additional isolation structures such as isolation trenches at the sides of the N-well to allow reduction of spacing between the NMOS and PMOS transistors. In the alternative and assuming the PMOS transistors could be located elsewhere, isolation between the portions of the critical node could be provided by an isolation trench rather than an N-well.

In view of the foregoing, it is seen that the invention provides a memory cell structure with greatly improved immunity to soft errors at virtually no cost in chip space and manufacturing complexity. Division and separation of transistors which may form the critical node of the storage cell by a well of opposite conductivity type achieves substantial reduction of charge collection efficiency of diffusion regions when subjected to ionizing radiation such that the probability of collecting a critical amount of charge, Qc is reduced to negligible levels. The layout of the memory cell in accordance with the invention also advantageously provides for a second port with no increase in complexity of manufacturing steps or additional layers and with only small increase in required chip space over a single port memory cell.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A memory cell comprising in combination:

a storage node including at least two spatially separated depletion regions formed in a semiconductor substrate of a first conductivity type;

a well of a second conductivity type formed in said semiconductor substrate and located between said at least two spatially separated depletion regions for reducing collection of charge engendered by ionizing radiation in the vicinity of a first of said at least two spatially separated depletion regions at a second of said at least two spatially separated depletions regions.

2. A memory cell comprising in combination:

a semiconductor substrate of a first conductivity type;

a well of a second conductivity type formed in said substrate;

two cross-coupled invertors;

each of said cross-coupled invertors including at least three transistors, two of said at least three transistors formed in said semiconductor substrate of said first conductivity type and one of said at least three transistors formed in said well of said second conductivity type;

each of said cross-coupled invertors including a storage node comprised of two spatially separated depletion regions formed by said two of said at least three transistors and;

said well of a second conductivity type located between said two spatially separated depletion regions for reducing collection of charge engendered by ionizing radiation in the vicinity of a first of said two spatially separated depletion regions as a second of said two spatially separated depletion regions.

3. A memory cell as recited in claim 2, wherein said transistors are field effect transistors.

4. A memory cell as recited in claim 2, wherein said transistors are complementary field effect transistors.

5. A memory cell as recited in claim 2, further including a bit line and a word line access transistor connected between said storage node and said bit line.

6. A memory cell as recited in claim 2, further including at least two bit lines and at least two word line access transistors, each said word line access transistor being connected between said storage node and a respective one of said at least two bit lines.

7. A memory cell as recited in claim 2, further including a bit line and a word line access transistor connected between said storage node and said bit line.

8. A memory cell as recited in claim 2, further including at least two bit lines and at least two word line access transistors, each said word line access transistor being connected between said storage node and a respective one of said at least two bit lines.

9. A memory cell as recited in claim 2, wherein said semiconductor substrate is a P-type semiconductor substrate.

10. A memory cell as recited in claim 2, wherein said two cross-coupled amplifiers include complementary metal oxide semiconductor field effect transistors.

* * * * *